(12) United States Patent
Hagemeyer

(10) Patent No.: US 6,768,166 B2
(45) Date of Patent: Jul. 27, 2004

(54) VERTICAL TRANSISTOR, MEMORY ARRANGEMENT AND METHOD FOR FABRICATING A VERTICAL TRANSISTOR

(75) Inventor: Peter Hagemeyer, Dresden (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 10/183,849

(22) Filed: Jun. 25, 2002

(65) Prior Publication Data

US 2003/0015755 A1 Jan. 23, 2003

(51) Int. Cl.[7] .................. H01L 29/792; H01L 29/76; H01L 29/94; H01L 31/062; H01L 31/113
(52) U.S. Cl. .................. 257/324; 257/329; 257/330
(58) Field of Search .................. 257/324, 325, 257/329, 330, 331, 332, 333

(56) References Cited

U.S. PATENT DOCUMENTS

| | | | |
|---|---|---|---|
| 4,774,556 A | * 9/1988 | Fujii et al. | .................. 257/316 |
| 5,379,255 A | 1/1995 | Shah | |
| 5,483,094 A | 1/1996 | Sharma et al. | |
| 5,561,308 A | * 10/1996 | Kamata et al. | .............. 257/301 |
| 5,563,083 A | 10/1996 | Pein | |
| 5,627,390 A | * 5/1997 | Maeda et al. | ................ 257/302 |
| 5,721,442 A | 2/1998 | Hong | |
| 6,157,060 A | 12/2000 | Kerber | |
| 6,312,992 B1 | * 11/2001 | Cho | .......................... 438/268 |
| 6,420,751 B1 | * 7/2002 | Maeda et al. | ................ 257/302 |
| 6,555,870 B1 | * 4/2003 | Kirisawa | .................... 257/324 |
| 2002/0175365 A1 | * 11/2002 | Hirayama | .................... 257/329 |

FOREIGN PATENT DOCUMENTS

| | | |
|---|---|---|
| DE | 100 12 112 A1 | 9/2001 |
| EP | 1 091 418 A2 | 4/2001 |
| WO | WO 02/015277 A2 | 2/2002 |

OTHER PUBLICATIONS

Nemati, F, Plummer, J, A Novel Thyristor-based SRAM Cell (T-RAM) for High-Speed, Low-Voltage, Giga-scale Memories, IEDM 99, pp. 283–286 (1999).

* cited by examiner

*Primary Examiner*—Ngân V. Ngô
(74) *Attorney, Agent, or Firm*—Altera Law Group, LLC; Jeffrey R. Stone

(57) ABSTRACT

A vertical transistor (100) has a source region (103), a drain region (109), a gate region (108), and a channel region (104) between the source region (103) and the drain region (109), which are arranged in a vertical direction in a semiconductor substrate (101), the gate region (104) having an electrical insulation from the source region (103), from the drain region (109) and from the channel region (104) and being arranged around the channel region (104) in such a way that the gate region (108) and the channel region (104) form a coaxial structure.

7 Claims, 5 Drawing Sheets

VERTICAL TRANSISTOR, MEMORY ARRANGEMENT AND METHOD FOR FABRICATING A VERTICAL TRANSISTOR

BACKGROUND OF THE INVENTION

1. Field of the Invention

The invention relates to a vertical transistor, a memory arrangement and a method for fabricating a vertical transistor.

2. Description of the Related Prior Art

In view of rapid ongoing development of computer technology, there is a need for storage media which provide ever greater storage quantities on ever smaller arrangements. Usually, larger quantities of data are stored in a large arrangement of memory cells. Memory cells used are, by way of example, nonvolatile memories which can store a stored item of information for a long period of time without loss of information. By way of example, transistors on silicon chips are used as nonvolatile memories.

However, as miniaturization advances further, conventional silicon microelectronics will encounter its limits. In particular, the development of increasingly smaller and more densely arranged transistors of, in the meantime, several hundred million transistors per chip will be subject to fundamental physical problems in the next ten years. In the event of the structural dimensions falling below 80 nm, quantum effects will have a disturbing influence on the components situated on the chips, and will predominate below dimensions of about 30 nm.

The increasing integration density of the components on the chips also leads to undesirable crosstalk between the components situated on the chips and to a dramatic increase in the waste heat. Therefore, increasing the storage density of transistor arrangements by means of advancing miniaturization of the transistor dimensions is a concept which will encounter physical limits in the foreseeable future.

Therefore, concepts with alternatives to the progressive miniaturization of the dimensions of individual transistors are being pursued. One concept which is being pursued for the purpose of further increasing the storage density is based on the basic idea of integrating transistors vertically instead of in planar fashion in the chips.

In this case, vertical transistors can be fabricated with physically required dimensions that are controllable in terms of production engineering, with increased packing density, in transistor arrangements. Especially nonvolatile memory cells using flash technology with gate oxides are often formed as vertical transistors since these memory cells require certain thicknesses for the gate oxides. This is due to the fact that tunnel effects using high voltages are utilized for programming or erasing the memory cells. Moreover, during fabrication vertical transistors afford the possibility of a freely selectable channel length, thereby making it possible to avoid the breakdown effects which occur in the case of space-reduced planar transistors.

However, in the case of the previously known concepts for vertical transistors, only the planar transistor structures are fabricated essentially vertically in the chips. Fabrication methods which are complicated and time-intensive thus result for the known vertical transistors. This is primarily due to the fact that the channel length must be sufficiently large in order to avoid breakdown effects between the two transistor main electrodes "source" and "drain". This consequently also requires a sufficiently large area for the transistor control electrode "gate", in order to be able to reliably control the charge carrier channel that forms between source and drain.

BRIEF SUMMARY OF THE INVENTION

Consequently, the invention is based on the problem of providing a vertical transistor, a memory arrangement and a method for fabricating a vertical transistor in which the machine and temporal outlay for the fabrication thereof is reduced.

The problem is solved by means of a vertical transistor, a memory arrangement and a method for fabricating a vertical transistor having the features in accordance with the independent patent claims.

A vertical transistor has a source region, a drain region, a gate region, and a channel region between the source region and the drain region. The source region, the channel region and the drain region are arranged in a vertical direction in a semiconductor substrate. The gate region has an electrical insulation from the source region, from the drain region and from the channel region. The gate region is arranged around the channel region in such a way that the gate region and the channel region form a coaxial structure.

A memory arrangement has a plurality of vertical transistors according to the invention, the vertical transistors being arranged next to one another in a memory matrix in the semiconductor substrate.

In a method for fabricating a vertical transistor, firstly a first electrically conductive region is produced on a semiconductor substrate. A channel region is then produced above the first electrically conductive region. Afterward, firstly an insulation layer and then a gate region are produced around the channel region in such a way that on the one hand, the channel region, the insulation layer and the gate region form a coaxial structure, and that on the other hand the gate region is electrically insulated from the first electrically conductive region. Finally, a second electrically conductive region is produced above the channel region, and is electrically insulated from the gate region.

One advantage of the invention can be seen in the fact that the problem of the time-intensive fabrication method is reduced by reducing the volume required for the vertical transistor according to the invention in the chip. This is achieved by virtue of the fact that, on account of the coaxial structure of the channel region and of the gate region, a large gate area is created despite a reduced channel length.

A further advantage of the invention is that the fabrication outlay is reduced on account of the coaxial structure, since the coaxial structure can be fabricated by means of symmetrical processes and masks. By way of example, the coaxial structure can be fabricated by means of selective deposition methods, selective etching methods and other self-aligning methods. This means that part of the fabrication process can be obviated, which results in a significant reduction of the process costs.

The coaxial structure of the vertical transistor according to the invention affords the advantage of a reduced space requirement of the vertical transistor in the directions parallel to the surface of the semiconductor substrate. As a result, an increased packing density can be achieved in a memory arrangement having a plurality of vertical transistors according to the invention. Consequently, future memory modules based on a memory arrangement having a plurality of vertical transistors according to the invention will be able to store a quantity of data of up to one Gbit.

In the case of the vertical transistor according to the invention, a charge carrier channel which can be formed between the source region and the drain region in the channel region can be coaxially constricted by means of an electric potential which can be applied to the gate region. This has the advantage of exact controllability of the position of the charge carrier channel and of charge carriers transferred in the charge carrier channel, and thus of the current flowing in the charge carrier channel. Moreover, the coaxial structure ensures reliable control of the charge carrier channel arranged between the source region and the drain region on account of a coaxial constriction. Undesirable charge carrier breakdowns between the source region and the drain region can thus be avoided.

In accordance with one exemplary embodiment of the vertical transistor according to the invention, the electrical insulation between channel region and gate region has a layer sequence comprising electrically insulating layers. The layer sequence preferably has a central layer bounded by two edge layers. In this case, the central layer is provided for storing electrical charge carriers. In this case, the electrical insulation is preferably an oxide-nitride-oxide layer sequence comprising a first oxide layer, a nitride layer and a second oxide layer.

Preferably, electrical charge carriers can be stored in a region of the central layer of the electrical insulation between the channel region and the gate region. In the case of an oxide-nitride-oxide layer sequence, the electrical charge carriers can then be stored in a region of the nitride layer.

In a preferred embodiment of the method according to the invention, a layer sequence comprising electrically insulating layers is produced as insulation layer between the channel region and the gate region. Preferably, electrical charge carriers are stored in a region of the insulation layer between the channel region and the gate region.

In a preferred development of the method according to the invention, a charge carrier channel is formed between the first electrically conductive region and the second electrically conductive region in the channel region, and can be coaxially constricted by means of an electric potential which can be applied to the gate region.

An oxide-nitride-oxide layer sequence comprising a first oxide layer, a nitride layer and a second oxide layer is produced as insulation layer between the channel region and the gate region. Electrical charge carriers are then stored in a region of the nitride layer between the channel region and the gate region.

An exemplary embodiment of the invention is illustrated in the figures and is explained in more detail below. In this case, identical reference signs designate identical components.

DETAILED DESCRIPTION OF THE INVENTION

Figure 1:
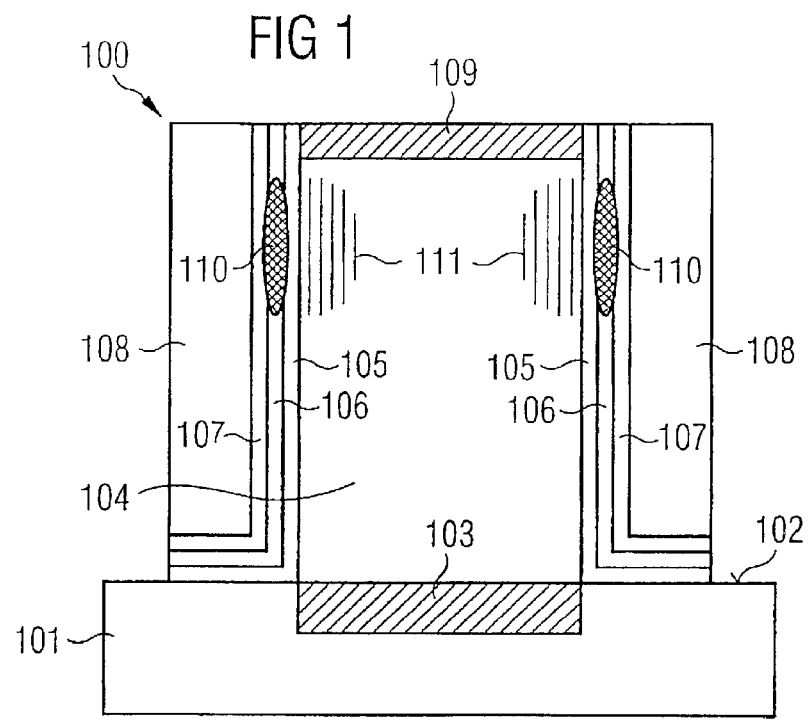
FIG. 1 shows a vertical cross section through a vertical transistor in accordance with an exemplary embodiment of the invention.

FIG. 1 shows a vertical cross section through a vertical transistor 100 in accordance with an exemplary embodiment of the invention.

In a semiconductor substrate 100 made of silicon, a first bit line is arranged at a main side 102, said bit line forming a source region 103 in the region of the vertical transistor. In accordance with this exemplary embodiment, the source region 103 is fabricated by means of an implantation of low-resistance doping atoms into the semiconductor substrate 100. In accordance with this exemplary embodiment, arsenic atoms or phosphorous atoms are used as doping atoms. In the case of an arrangement of a plurality of vertical transistors 100 in a memory matrix, the source region 103 may be provided as buried, continuous source region 103 for all of the vertical transistors 100.

Arranged above the source region 103 is a channel region 104, which is arranged cylinder-symmetrically about an axis of symmetry (not illustrated) oriented vertically with respect to the main side 102. In accordance with the present exemplary embodiment of the invention, the channel region 104 has a diameter of the order of magnitude of 150 nm and an extent directed vertically with respect to the main side 102 of no less than 150 nm. The extent of the channel region 104 that is directed vertically with respect to the main side 102 is also referred to as the channel length.

The channel region 104 is enclosed, parallel to the main side 102, by a layer sequence comprising a first oxide layer 105, a nitride layer 106 and a second oxide layer 107 and also a gate region 108. The gate region 108 is electrically insulated from the channel region 104 and also from the semiconductor substrate 101, in particular the source region 103, by means of the layer sequence 105, 106, 107. The channel region 104, the layer sequence 105, 106, 107 and the gate region 108 together form a coaxial structure. In this case, the coaxial structure has a coaxial direction which is oriented parallel to the main side 102 and radially with respect to the axis of symmetry of the channel region 104.

Arranged above the channel region 104 is a drain region 109, which bounds the channel region 104 toward the top parallel to the main side 102. The drain region 109 is electrically coupled to a second bit line (not illustrated) and electrically insulated from the gate region 108. Between the source region 103 and the drain region 109, when a voltage is applied on the two bit lines, a charge carrier channel can be formed in the channel region 104.

In order to control the charge carrier channel, an electric potential can be applied to the gate region 108, which electrical potential influences the channel region 104 by means of electric field effects. In addition, charge carriers can be stored in the nitride layer 106 of the layer sequence 105, 106, 107, thereby producing a ring of stored charge carriers 110 in the nitride layer 106. Both the ring of stored charge carriers 110 and an electric potential applied to the gate region 108 lead to a coaxial channel constriction 111 and thus to a control of the charge carrier channel in the channel region 104.

Given a suitable, radially overlapping coaxial channel constriction 111, the charge carrier flow between the source region 103 and the drain region 109 can be completely prevented, i.e. a current flow in the vertical transistor 100 is no longer possible. In this way, it is also possible to avoid an undesirable breakdown effect in the vertical transistor 100 despite a short channel length.

The ring of stored charge carriers 110 is produced in the nitride layer 106 by means of the so-called "channel hot electron injection" effect instead of the conventional Fowler-Nordheim tunnel effect. In this case, very fast, and therefore hot, charge carriers are injected from the source region 103 via the channel region 104 into the nitride layer 106. Here, the charge carriers are captured between the electrically insulating layers, specifically between the two oxide layers 105, 107 acting as insulating edge layers, and stored.

Figure 2:
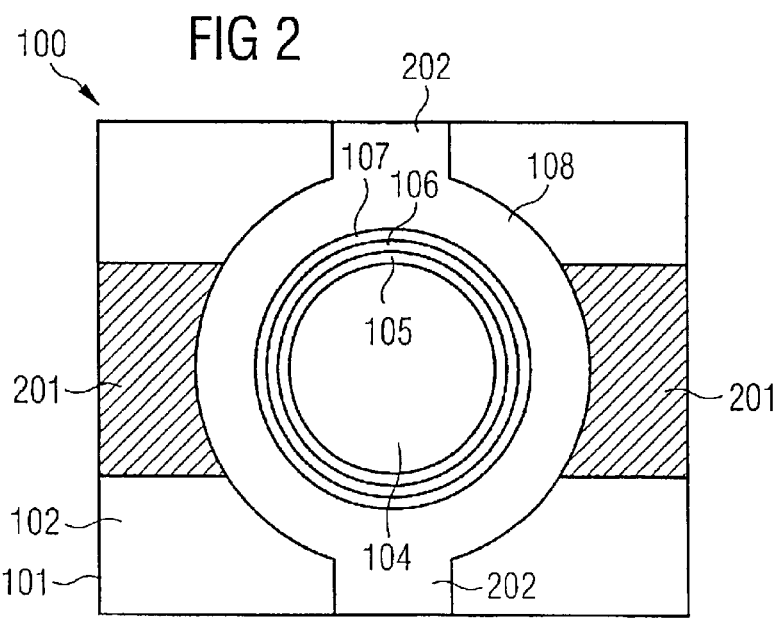
FIG. 2 shows a horizontal cross section through the vertical transistor in accordance with an exemplary embodiment of the invention.

FIG. 2 shows a horizontal cross section through the vertical transistor 100 in accordance with the exemplary embodiment of the invention.

This representation illustrates the coaxial structure of the channel region 104, of the layer sequence 105, 106, 107 and of the gate region 108. Also visible is the first bit line 201 at the main side 102 of the semiconductor substrate 101, which is utilized as source region 103 in the region of the vertical transistor 100. The situation with the second bit line (not illustrated) and the drain region 109 is analogous to the first bit line 201 and the source region 103. In this exemplary embodiment, two word lines 202 are electrically connected to the gate region 108. Outside the vertical transistor 100, the first bit line 201 and the word lines 202 serve for connecting the vertical transistor 100 to an electronic circuit.

A method for forming a vertical transistor 100 will now be described step by step below.

Figure 3:
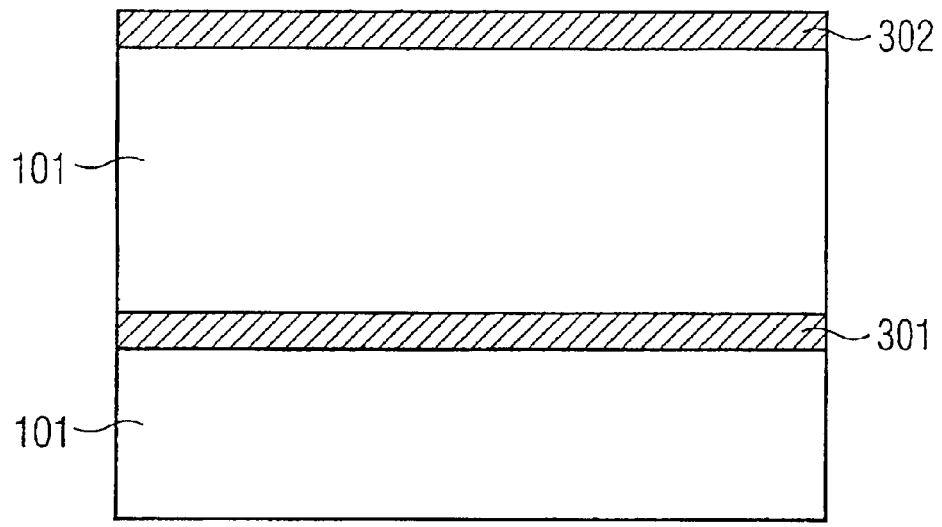
FIG. 3 shows a vertical cross section through the vertical transistor at a first point in time during the fabrication in accordance with the exemplary embodiment of the invention.

FIG. 3 shows a vertical cross section through the vertical transistor 100 at a first point in time during the fabrication in accordance with the exemplary embodiment of the invention.

Firstly, a source layer 301 and a drain layer 302 are produced by means of implantation of arsenic atoms or phosphorous atoms in a semiconductor substrate 100 made of silicon. As an alternative, the source layer 301 and the drain layer 302 can also be produced by means of bonding of different layer structures. In accordance with this exemplary embodiment of the invention, the source layer 301 is configured in such a way that it extends beyond the region of the vertical transistor 100 and later fulfils the function of the first bit line 201. As an alternative, the source layer 301 can also be provided as a local, buried source contact.

Figure 4:
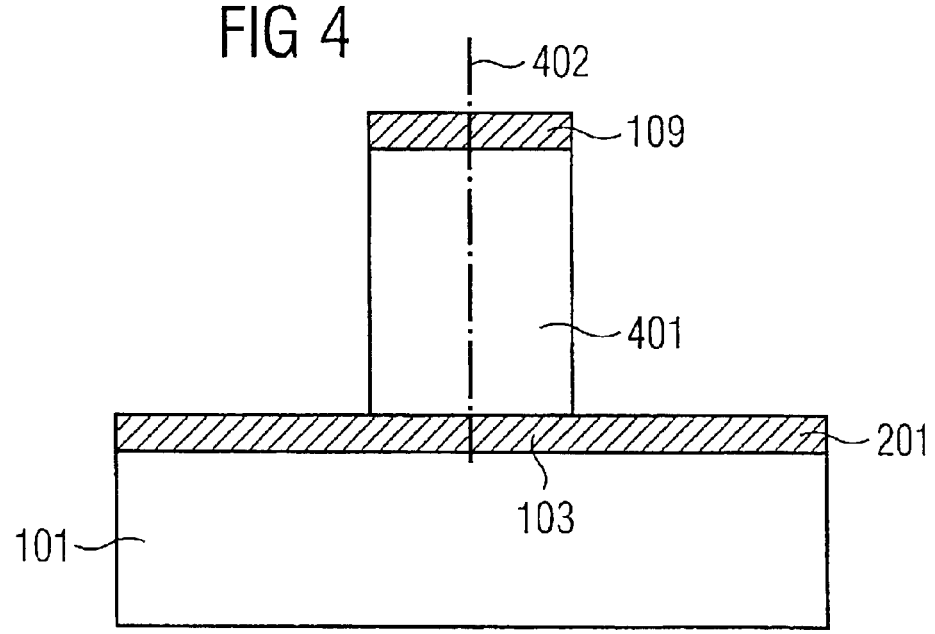
FIG. 4 shows a vertical cross section through the vertical transistor at a second point in time during the fabrication in accordance with the exemplary embodiment of the invention.

FIG. 4 shows a vertical cross section through the vertical transistor 100 at a second point in time during the fabrication in accordance with the exemplary embodiment of the invention.

Parts of the drain layer 302 and of the semiconductor substrate 101 above the source layer 301 are removed by means of an etching operation. The source layer 301 is patterned by means of the etching in such a way that the first bit line 201 with the integrated source region 103 remains above the remaining semiconductor substrate 101. A cylindrical central region 401 is situated above the source region 103 after the etching operation. Said central region is cylinder-symmetrical with respect to the axis 402 of symmetry. The cylindrical central region 401 is bounded parallel to the source region 103 by the residues of the drain layer 302, which now form the drain region 109.

Boron atoms are subsequently diffused into the cylindrical central region and incorporated into the existing silicon crystal lattice by means of a heat treatment operation. The channel region 104, which can conduct electrical charge carriers, is thus formed from the cylindrical central region 401.

Figure 5:
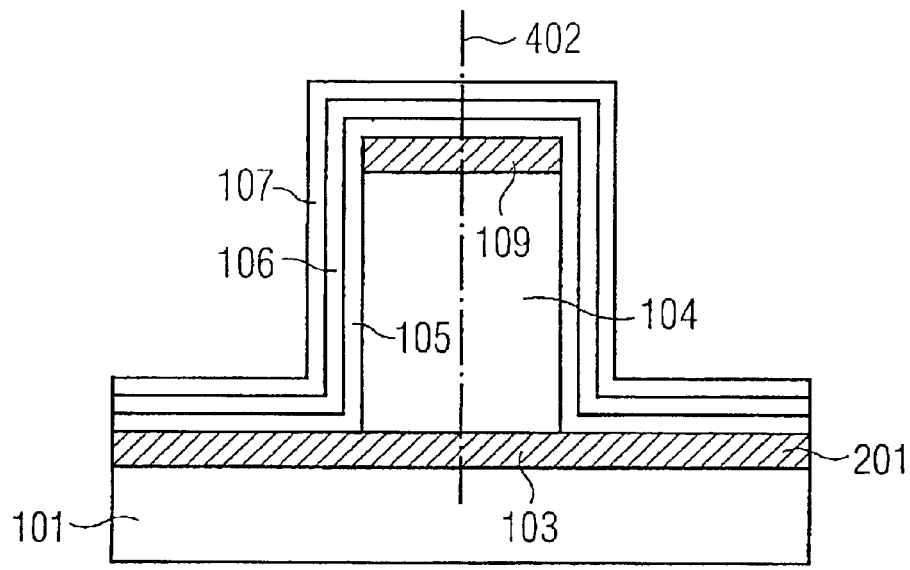
FIG. 5 shows a vertical cross section through the vertical transistor at a third point in time during the fabrication in accordance with the exemplary embodiment of the invention.

FIG. 5 shows a vertical cross section through the vertical transistor 100 at a third point in time during the fabrication in accordance with the exemplary embodiment of the invention.

A layer sequence comprising a first oxide layer 105, a nitride layer 106 and a second oxide layer 107 is now produced above the channel region 104 and also above the drain region 109 and the first bit line 201. In this case, silicon dioxide ($SiO_2$) is chosen as material for the two oxide layers 105, 107 and silicon nitride ($Si_3N_4$) is chosen for the nitride layer 106. In this case, the layer sequence 105, 106, 107 acts as electrical insulation layer for the channel region 104.

Figure 6:
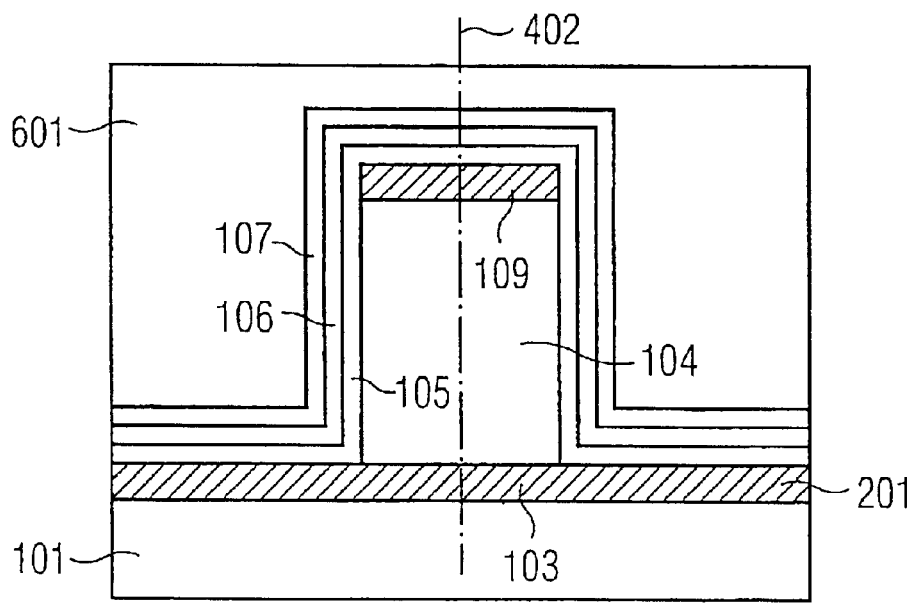
FIG. 6 shows a vertical cross section through the vertical transistor at a fourth point in time during the fabrication in accordance with the exemplary embodiment of the invention.

FIG. 6 shows a vertical cross section through the vertical transistor 100 at a fourth point in time during the fabrication in accordance with the exemplary embodiment of the invention.

Polysilicon is now deposited above the layer sequence 105, 106, 107 in an overfilling manner in order to form a word line layer 601. As an alternative, it is also possible to use another electrically conductive material to form the word line layer 601. By way of example, it is possible firstly to deposit a thin polysilicon layer above the layer sequence 105, 106, 107. Afterward, a silicide layer, i.e. a layer made of a metal-silicon compound, is deposited on the thin polysilicon layer, the thin polysilicon layer together with the silicide layer then forming the word line layer 601.

Figure 7:
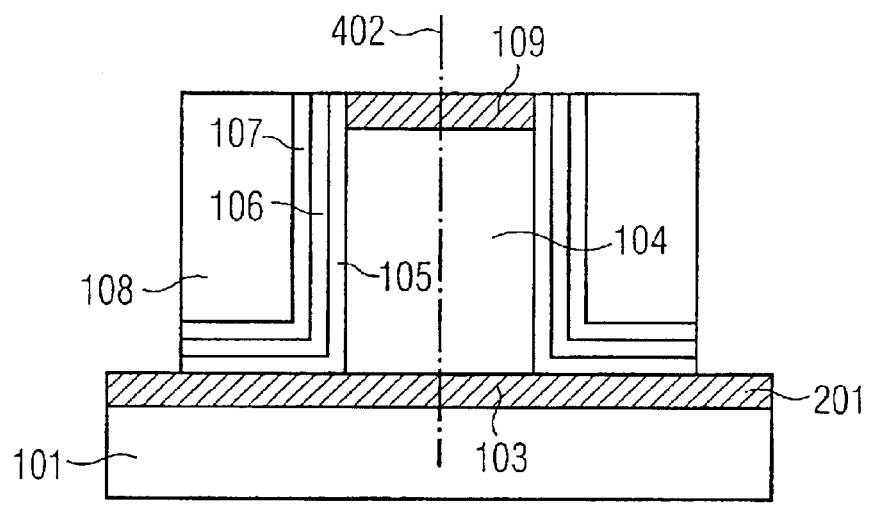
FIG. 7 shows a vertical cross section through the vertical transistor at a fifth point in time during the fabrication in accordance with the exemplary embodiment of the invention.

FIG. 7 shows a vertical cross section through the vertical transistor 100 at a fifth point in time during the fabrication in accordance with the exemplary embodiment of the invention.

The word line layer 601 is now etched in order to form the gate region 108 and also the word lines 202 connected thereto. In this case, a mask, patterned in a lithography process, in the region of the vertical transistor 100 covers the word line layer 601 circularly in such a way that the gate region 108 is formed cylinder-symmetrically about the axis 402 of symmetry during an etching process. The etching process ends at the moment at which the surface of the first bit line 201 is uncovered. As a result, the layer sequence 105, 106, 107 is also restricted, parallel to the first bit line 201, to the diameter prescribed by the mask. Moreover, the word line layer 601 and also the layer sequence 105, 106, 107 are removed locally above the drain region 109 in order to uncover the drain region 109.

Figure 8:
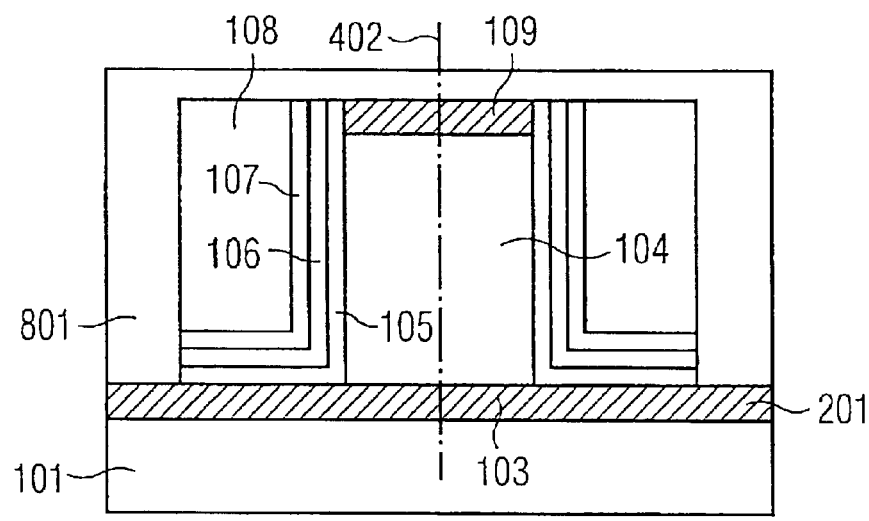
FIG. 8 shows a vertical cross section through the vertical transistor at a sixth point in time during the fabrication in accordance with the exemplary embodiment of the invention.

FIG. 8 shows a vertical cross section through the vertical transistor 100 at a sixth point in time during the fabrication in accordance with the exemplary embodiment of the invention.

An overfilling electrical insulation 801 is formed above the semiconductor structure that has been produced. Said insulation prevents electrical crosstalk both within the vertical transistor 100 and from the vertical transistor 100 to the surroundings.

Figure 9:
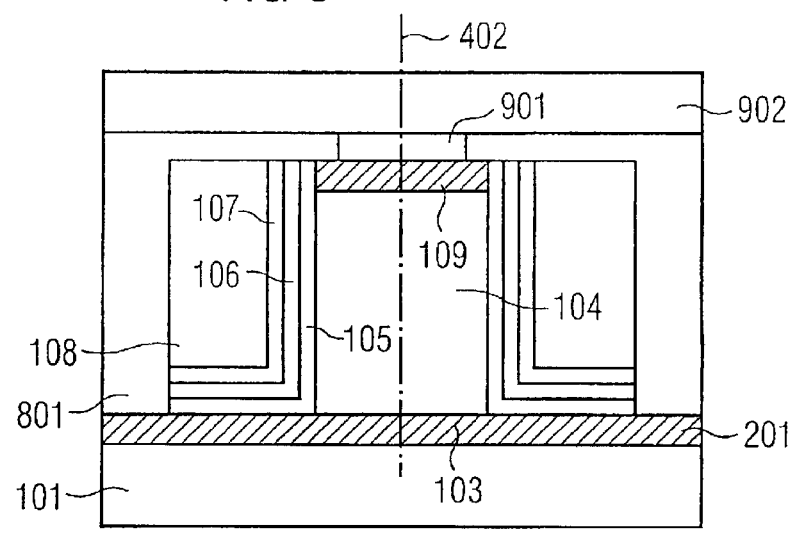
FIG. 9 shows a vertical cross section through the vertical transistor at a seventh point in time during the fabrication in accordance with the exemplary embodiment of the invention.

FIG. 9 shows a vertical cross section through the vertical transistor 100 at a seventh point in time during the fabrication in accordance with the exemplary embodiment of the invention.

A contact hole 901 is etched into the electrical insulation 801 until a part of the drain region 109 is uncovered. Afterward, a metalization plane is formed above the electrical insulation 801 and above the contact hole 901. The second bit line 902, which is in electrical contact with the drain region 109 by means of the contact hole 901, is arranged in the metalization plane.

Figure 10:
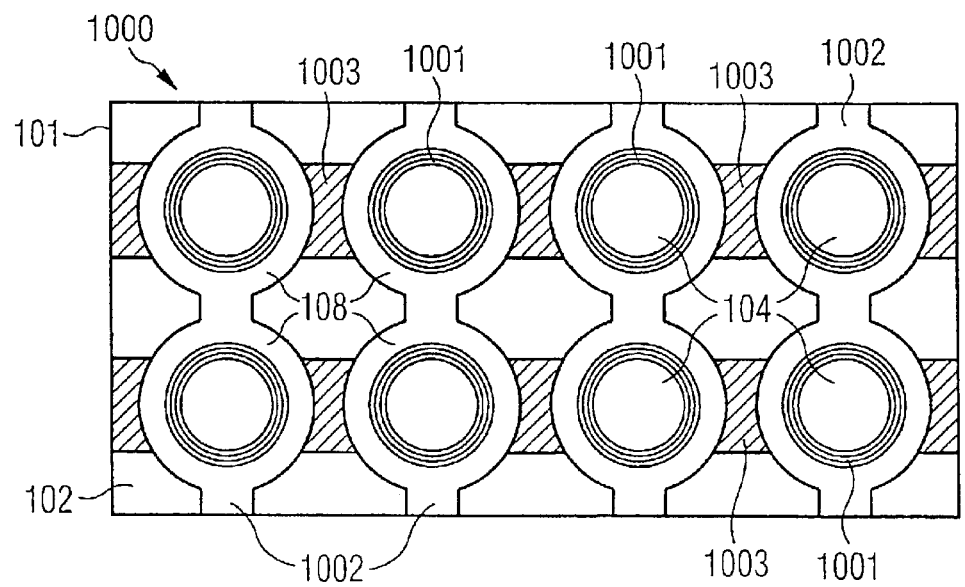
FIG. 10 shows a horizontal cross section through a memory arrangement having a plurality of vertical transistors in accordance with the exemplary embodiment of the invention.

FIG. 10 shows a horizontal cross section through a memory arrangement 1000 having a plurality of vertical transistors 100 in accordance with the exemplary embodiment of the invention.

This representation differs from the representation of FIG. 2 in that instead of a single vertical transistor 100 a memory arrangement 1000 having a plurality of vertical transistors 100 is now arranged on the semiconductor substrate 101. For a detailed representation of the ONO layer sequence 1001, reference is made to FIG. 1 and FIG. 2.

The memory arrangement 1000 is constructed in such a way that the vertical transistors 100 are arranged in columns and rows. In this case, the gate regions 108 of the vertical transistors 100 within a column are electrically connected to one another by a continuous word line 1002. The source regions 103 of the vertical transistors 100 within a row are electrically connected to one another by a continuous bit line 1003. The drain regions 109 of a plurality of vertical transistors 100 are also electrically connected to one another by a further continuous bit line (not illustrated).

List of References
100 Vertical transistor according to the invention
101 Semiconductor substrate
102 Main side
103 Source region
104 Channel region
105 First oxide layer
106 Nitride layer
107 Second oxide layer
108 Gate region
109 Drain region
110 Ring of stored charge carriers
111 Coaxial channel constriction
201 First bit line
202 Word line
301 Source layer
302 Drain layer
401 Cylindrical central region
402 Axis of symmetry
601 Word line layer
801 Electrical insulation
901 Contact hole
902 Second bit line
1000 Memory arrangement according to the invention
1001 ONO layer sequence
1002 Continuous word line
1003 Continuous bit line

What is claimed is:

1. Vertical storage transistor having a source region;

having a drain region;

having a gate region; and having a channel region between the source region and the drain region;

the source region, the channel region and the drain region being arranged in a vertical direction in a semiconductor substrate;

the gate region having an electrical insulation from the source region, from the drain region and the from the channel region; and the gate region being arranged around the channel region in such a way that the gate region and the channel region form a coaxial structure;

wherein the electrical insulation between channel region and gate region is an oxide-nitride-oxide layer sequence comprising a first oxide layer, a nitride layer and a second oxide layer, wherein electrical charge carriers can be stored in a region of the nitride layer.

2. Vertical transistor according to claim 1, in which the electrical insulation between channel region and gate region is a layer sequence comprising electrically insulating layers.

3. Vertical transistor according to claim 1, in which a charge carrier channel which can be formed between the source region and the drain region in the channel region can be coaxially constricted by means of an electric potential which is applyable to the gate region.

4. Vertical transistor according to claim 1, in which electrical charge carriers can be stored in a region of the electrical insulation between the channel region and the gate region.

5. Vertical transistor according to claim 1, in which the electrical insulation between channel region and gate region is an oxide-nitride-oxide layer sequence comprising a first oxide layer, a nitride layer and a second oxide layer.

6. Vertical transistor according to claim 5, in which electrical charge carriers can be stored in a region of the nitride layer.

7. Memory arrangement having a plurality of vertical transistors according to claim 1, in which the vertical transistors are arranged next to one another in a memory matrix in the semiconductor substrate.

* * * * *

UNITED STATES PATENT AND TRADEMARK OFFICE
CERTIFICATE OF CORRECTION

PATENT NO.   : 6,768,166 B2
DATED        : July 27, 2004
INVENTOR(S)  : Peter Hagemeyer It is certified that error appears in the above-identified patent and that said Letters Patent is hereby corrected as shown below:

<u>Title page,</u>
Insert Item:
-- [30] Foreign Application Priority Data
Jun. 26, 2001 (DE) 101 30 766.7 --.

Signed and Sealed this

Thirty-first Day of January, 2006

JON W. DUDAS
*Director of the United States Patent and Trademark Office*